(12) United States Patent
Cram

(10) Patent No.: US 7,043,388 B2
(45) Date of Patent: May 9, 2006

(54) SYSTEM AND APPARATUS FOR TESTING PACKAGED DEVICES AND RELATED METHODS

(75) Inventor: Daniel P. Cram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 53 days.

(21) Appl. No.: 10/743,166

(22) Filed: Dec. 22, 2003

(65) Prior Publication Data

US 2005/0134299 A1    Jun. 23, 2005

(51) Int. Cl.
G01R 27/28 (2006.01)
H05K 1/00 (2006.01)

(52) U.S. Cl. ............... 702/117; 702/118; 439/79
(58) Field of Classification Search ........... 702/117, 702/118; 439/73, 78, 79, 94
See application file for complete search history.

(56) References Cited

U.S. PATENT DOCUMENTS

| | | | |
|---|---|---|---|
| 4,567,652 A * | 2/1986 | Gussman et al. ............. 29/837 |
| 4,926,117 A | 5/1990 | Nevill | |
| 5,267,395 A | 12/1993 | Jones, Jr. et al. | |
| 5,739,050 A | 4/1998 | Farnworth | |
| 5,815,000 A | 9/1998 | Farnworth et al. | |
| 5,894,218 A | 4/1999 | Farnworth et al. | |
| 5,994,784 A | 11/1999 | Ahmad | |
| 6,018,249 A | 1/2000 | Akram et al. | |
| 6,025,728 A | 2/2000 | Hembree et al. | |
| 6,048,744 A | 4/2000 | Corisis et al. | |
| 6,064,194 A | 5/2000 | Farnworth et al. | |
| 6,072,233 A | 6/2000 | Corisis et al. | |
| 6,072,323 A | 6/2000 | Hembree et al. | |
| 6,081,429 A | 6/2000 | Barrett | |
| 6,094,058 A | 7/2000 | Hembree et al. | |
| 6,107,122 A | 8/2000 | Wood et al. | |
| 6,150,717 A | 11/2000 | Wood et al. | |
| 6,163,956 A | 12/2000 | Corisis | |
| 6,188,232 B1 | 2/2001 | Akram et al. | |
| 6,198,172 B1 | 3/2001 | King et al. | |
| 6,208,156 B1 | 3/2001 | Hembree | |
| 6,246,108 B1 | 6/2001 | Corisis et al. | |
| 6,247,629 B1 | 6/2001 | Jacobson et al. | |
| 6,252,772 B1 | 6/2001 | Allen | |
| 6,255,833 B1 | 7/2001 | Akram et al. | |
| 6,285,204 B1 | 9/2001 | Farnworth | |
| 6,294,839 B1 | 9/2001 | Mess et al. | |
| 6,437,586 B1 | 8/2002 | Robinson | |
| 6,476,629 B1 | 11/2002 | Bjork | |
| 2002/0016091 A1 * | 2/2002 | Perino et al. .................. 439/73 |
| 2004/0112142 A1 | 6/2004 | Min et al. | |

* cited by examiner

*Primary Examiner*—John Barlow
*Assistant Examiner*—Meagan S Walling
(74) *Attorney, Agent, or Firm*—Perkins Coie LLP

(57) ABSTRACT

A testing system is disclosed for testing a packaged device having a body with a package profile and an array of contacts coupled to the body. In one embodiment, the system includes a socket having a receiving area and an array of leads arranged to engage the array of contacts on the packaged device. The system of this embodiment also has a package handling assembly with a placement head and an alignment element coupled to the placement head. The alignment element is movable with the placement head as a unit relative to the socket. The alignment element is positionable in the receiving area of the socket. The alignment element restricts movement of the packaged device in at least two dimensions relative to the array of leads when the packaged device is positioned in the receiving area adjacent to the array of leads.

65 Claims, 8 Drawing Sheets

SYSTEM AND APPARATUS FOR TESTING PACKAGED DEVICES AND RELATED METHODS

TECHNICAL FIELD

The present invention generally relates to systems, apparatus and methods for testing packaged devices, microelectronic devices, micromechanical devices, and other devices with microfeatures.

BACKGROUND

Conventional packaged devices such as integrated circuit (IC) devices are painstakingly manufactured for specific performance characteristics required for use in a wide range of electronic equipment. IC devices typically include a die with electronic circuitry, a casing encapsulating the die, and an array of external contacts. IC devices have an outer shape that defines a package profile. The external contacts can be pin-like leads or ball-pads of a ball-grid array. The ball-pads are arranged in a selected pattern, and solder balls are connected to the ball-pads. Ball-grid arrays generally have solder balls arranged, for example, in 6×9, 6×10, 6×12, 6×15, 6×16, 8×12, 8×14, or 8×16 patterns on the IC device, but other patterns are also used. Many IC devices with different circuitry can have the same ball-grid array but different outer profiles.

After IC devices are packaged, they are generally tested and marked in several post-production batch processes. Burn-in testing is one such post-production process for detecting whether any of the IC devices are likely to fail. Burn-in testing is performed before shipping IC devices to customers or using IC devices in electronic equipment.

Burn-in testing of IC devices typically involves applying specified electrical biases and signals in a controlled temperature environment. The IC devices are generally tested in more severe conditions and/or under more rigorous performance parameters than they are likely to experience during normal operation. During a typical burn-in test, several IC devices are loaded onto burn-in boards, and a batch of loaded burn-in boards is then placed in a test chamber (i.e., burn-in oven) that provides a controlled environment.

Burn-in boards are commonly printed circuit boards that conduct the electrical input/output parameters to the packaged devices. One example of a conventional burn-in board includes a printed circuit board and a plurality of sockets on the printed circuit board. The sockets each have a selected array of electrical leads electrically coupled to conductive lines in the printed circuit board. The electrical leads also have exposed contact tips positioned to engage solder balls of an IC device loaded into the socket. The conventional socket also has a nesting member with an opening that is shaped to closely correspond to the outer profile or shape of the IC device. The conventional nesting member receives the IC device and controls the position of the IC device within the socket in three dimensions (e.g., X, Y and Z axes). Accordingly, the nesting member ensures precise placement of the IC device in the socket so that the solder balls contact the correct electrical leads without damaging the solder balls. Precise and repeatable positioning of the IC devices in the sockets is essential for accurate and efficient burn-in testing of the IC device.

One problem with conventional burn-in boards is that it is difficult to perform burn-in tests for runs of IC devices with different profiles. In conventional systems, each socket typically has a dedicated nesting member configured to be used with IC devices with the same outer profile. The dedicated nesting member is accordingly used throughout several burn-in tests for IC devices with identical profiles. However, to test IC devices with different profiles on the same burn-in board requires reconfiguring all of the sockets to accommodate the different outer profiles. The sockets are reconfigured by removing the nesting members shaped for the outer profile of one type of IC device from each socket and attaching different nesting members specifically shaped and sized for the outer profile of another type of IC device. In a typical large scale manufacturing process for IC devices, reconfiguring burn-in boards to test IC devices having a different outer profile usually involves reconfiguring thousands of sockets. This process is extremely labor intensive, time consuming, and expensive because it not only requires thousands of new nests and many hours of skilled labor, but it also results in costly down time for the burn-in boards and testing equipment. Moreover, the nesting members and the sockets can also be damaged during the process of changing the nesting members. Therefore, conventional systems are not well suited for performing burn-in tests on IC devices with different profiles.

DETAILED DESCRIPTION

A. Overview

Figure 1:
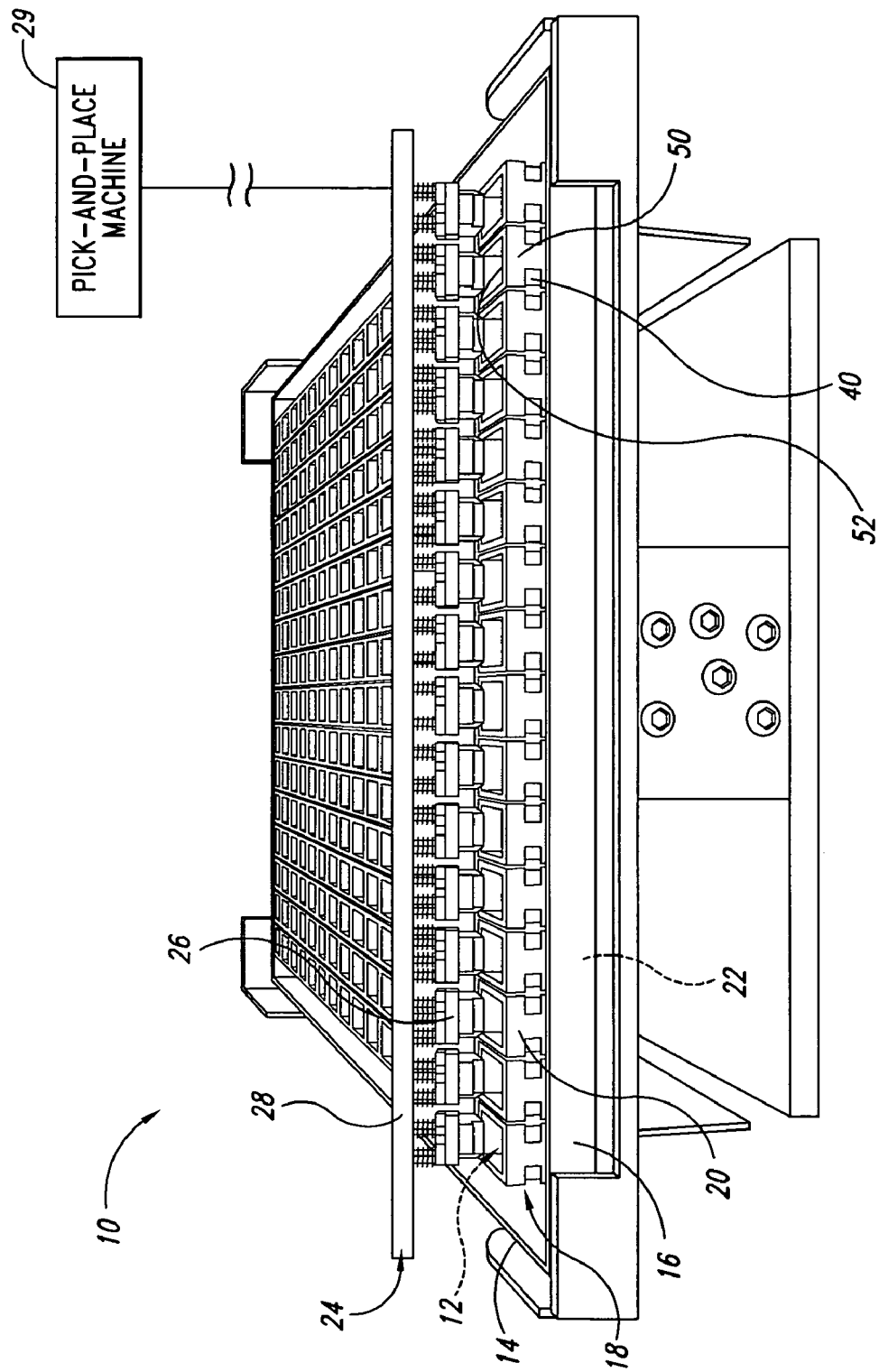
FIG. 1 is an isometric view of a testing system for testing packaged devices in accordance with one embodiment of the invention.

The following disclosure describes several embodiments for systems and apparatus for testing packaged devices, such as microelectronic devices, micromechanical devices, or other devices with microfeature components. Many specific details of the invention are described below with reference to a burn-in board with a plurality of sockets for testing the packaged devices, but embodiments can be used in other testing systems in the manufacturing of packaged devices. Several embodiments in accordance with the invention are set forth in FIGS. 1–13 and in the following text to provide a thorough understanding of particular embodiments of the invention. A person skilled in the art will understand, however, that the invention may have additional embodiments, or that the invention may be practiced without several of the details of the embodiments shown in FIGS. 1–13.

One aspect of the invention is directed to testing systems for testing a packaged device having a body with a package profile and an array of contacts coupled to the body. In one embodiment, the system includes a socket connectable to a testing substrate. The socket has an array of leads arranged to engage the array of contacts on the packaged device. The socket has a receiving area proximate to the array of leads and configured to receive the packaged device therein.

The system of this embodiment also has a package handling assembly with a placement head and an alignment element coupled to the placement head. The alignment element is movable with the placement head as a unit relative to the socket to be positioned at the receiving area of the socket. The alignment element has an alignment portion configured to receive the packaged device and restrict movement of the packaged device in at least two dimensions relative to the array of leads as the packaged device passes through the alignment portion. The alignment portion accordingly positions the packaged device in the receiving area adjacent to the array of leads.

Another aspect of the invention is directed to methods of testing a packaged device having an array of contacts and a package profile. In one embodiment, the method includes moving a packaged device along a load/unload path through an alignment element that restricts movement of the package laterally with respect to the load/unload path. For example, the alignment element is positioned in a socket and then a packaged device passes through an aperture in the alignment element that guides the packaged device in a manner so that the contacts are aligned with corresponding leads in the socket. The packaged device is placed against the socket with the array of contacts contacting the array of leads. The alignment element is then removed from the socket without removing the packaged device, and the packaged device is tested in the socket. The alignment element is accordingly separate from the socket.

A feature of several testing systems in accordance with certain embodiments of the invention is that the testing system can be reconfigured to test packaged devices having different profiles. For example, a testing system can have a socket with a lead array and a handling assembly having a placement head with a first alignment element. The first alignment element has a first aperture having first guide portions configured to align a first package having a first profile with the lead array. The placement head moves between a first position at which the first aperture is proximate the lead array and a second position at which the alignment element is spaced apart from the socket. After loading a plurality of first packaged devices onto sockets through the first alignment array, second packaged devices with different profiles can be loaded onto the sockets without necessarily reconfiguring the sockets by (a) removing the first alignment element from the placement head, (b) attaching a second alignment element to the placement head, (c) moving the second alignment element between the first and second positions, and (d) passing individual second packaged devices through the second alignment element when the second alignment element is in the first position proximate the socket. The second alignment element has a second aperture with second guide portions configured to align the second packaged devices with the lead arrays.

B. Testing Systems

FIG. 1 is an isometric view of a testing system 10 for testing a plurality of packaged devices 12 in accordance with an embodiment of the invention. In this disclosure the term "packaged device" includes micromechanical devices, microelectronic devices, and other devices with microfeature components. In the illustrated embodiment, the testing system 10 is configured for burn-in testing of packaged devices 12 to verify and ensure that the packaged devices function according to specification.

The testing system 10 includes a bed 14 that removably receives a tray 16. The tray 16 includes a burn-in board 18 having a plurality of sockets 20 operatively mounted on a printed circuit board 22. In the illustrated embodiment, the burn-in board 18 includes a 16×16 array of substantially identical sockets 20. The burn-in board 18, however, is not limited to having a 16×16 array of sockets and can have other socket configurations.

The testing system 10 also includes a package handling system 24 over the burn-in board 18. The package handling assembly 24 includes a row of placement heads 26 mounted on an elongated support bar 28. The placement heads 26 are positioned on the support bar 28 so that each placement head is aligned with a respective one of the sockets 20 in a row of sockets on the burn-in board 18. The package handling assembly 24 also includes a vacuum pick-and-place system 29 (shown schematically) that transports individual packaged devices 12 to and from individual placement heads 26 and sockets 20. In operation, the elongated support bar 28 moves downwardly to position each placement head 26 at a corresponding socket 20.

The pick-and-place system 29 in one embodiment has two sets of pick-and-place heads (not shown), and each set includes sixteen pick-and-place heads. Each pick-and-place head includes a pick up member that has a partial vacuum being drawn through an interior channel. The pick-and-place heads use the partial vacuum to pick up a packaged device 12 from a selected area, and then the pick-and-place heads transport the packaged devices 12 to the placement heads 26. As the pick-and-place heads are picking up the packaged devices 12 and moving toward the placement heads 26, the placement heads are positioned in a row of sockets 20, as discussed in greater detail below. The pick-and-place heads pass the packaged devices 12 through the placement heads 26 and into the sockets 20. The placement heads 26 align the packaged devices 12 with the sockets 20 also discussed in greater detail below, so the packaged devices 12 can be quickly and precisely loaded into the sockets 20.

The pick-and-place heads position the packaged devices 12 within placement heads 26 so the packaged devices are each spaced slightly apart from the testing sockets 20 by a small gap (e.g., by approximately 1 mm). The vacuum in each pick-and-place head is then terminated, so the packaged device 12 precisely drops into position on the testing socket 20. In one embodiment, the packaged device 12 can be separated from the pick-and-place head by blowing a puff of air through the pick-up member, thereby blowing the packaged device off of the pick-and-place head. The packaged device 12 then drop across the small gap and into precise position on the testing socket 20.

After the packaged devices 12 are loaded into the row of the testing sockets 20, the first set of pick-and-place heads are lifted out of the placement heads 26. The support bar 28 and placement heads 26 are then raised to a position above the testing sockets 20. The bed 14 of the testing system 10 moves the burn-in board 18 so as to index the next row of testing sockets 20 below the row of placement heads 26. The support bar 28 is then lowered and the placement heads 26 are positioned in the row of testing sockets 20. In one embodiment, the second set of pick-and-place heads are loaded with packaged devices 12 while the first set of pick-and-place heads is delivering its sixteen packaged devices, as discussed above. The loaded second set of pick-and-place heads is then moved into positioned in the placement heads 26 in the same manner discussed above to deliver the packaged devices into the next row of testing sockets. While the second set of pick-and-place heads is delivering the packaged devices 12, the first set of pick-and-place heads are loaded with other packaged devices to be delivered in the next row of testing sockets 20. The first and second sets of pick-and-place heads alternate in loading rows of the testing sockets 20 until the burn-in board 18 is loaded.

In alternate embodiments, other arrangements of pick-and-place heads can be used to load the packaged devices 12 into the placement heads 26 and into the testing sockets 20. For example, a single set of pick-and-place heads can be used to load each row of sockets 20. In another embodiment, a single pick-and-place head could be used to load each socket 20. In another embodiment, the placement heads 26 can be coupled directly to the pick-and-place heads so as to move together when the packaged devices 12 are picked up and delivered to the testing sockets 20.

Figure 2:
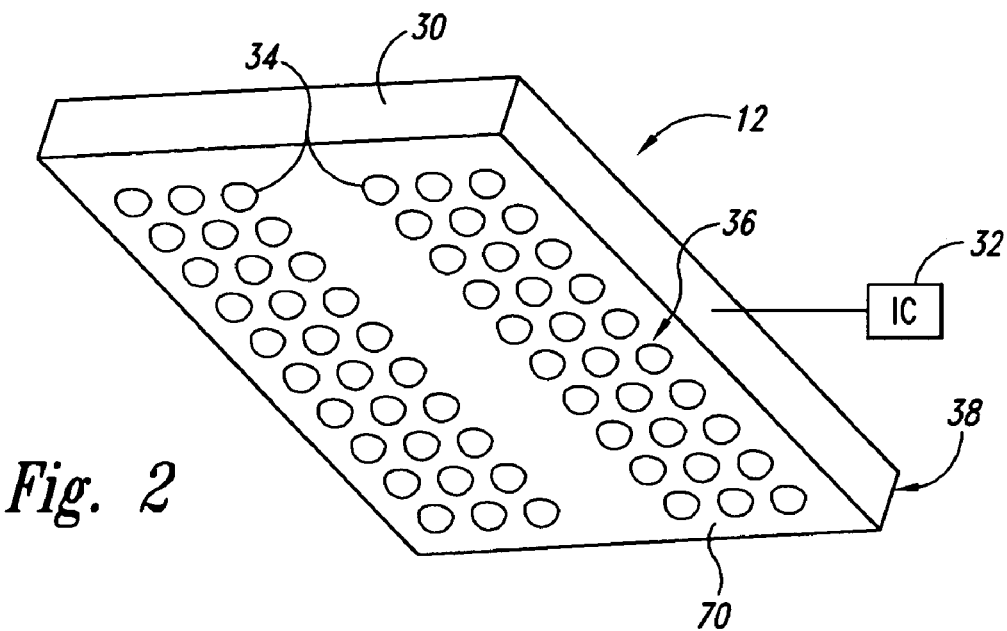
FIG. 2 is an enlarged bottom isometric view of one packaged device of the type testable by the testing system of FIG. 1.

FIG. 2 is an enlarged bottom isometric view of a conventional packaged device 12 that contains internal circuitry 32 (shown schematically). The illustrated packaged device 12 has a profile 38 defined by the perimeter edge of the top or bottom surface. The profile 38 of the packaged device 12 can be different than the embodiment shown in FIG. 2. The internal circuitry 32 is operatively connected to a plurality of electrically conductive ball-pads that carry solder balls 34 arranged in a ball-grid array 36. In the illustrated embodiment, the ball-grid array 36 is a 6×10 array, but the packaged device 12 can have different ball-grid arrays.

Figure 3:
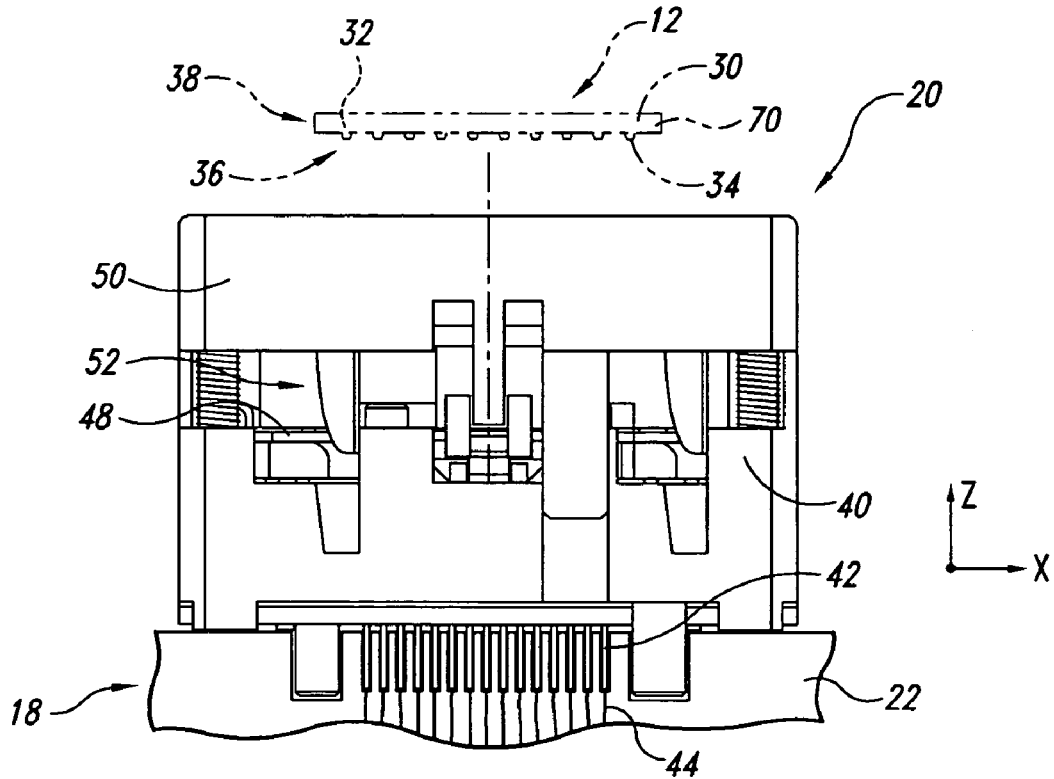
FIG. 3 is an enlarged side elevation view of a socket on a burn-in board in the testing system of FIG. 1.
Figure 4:
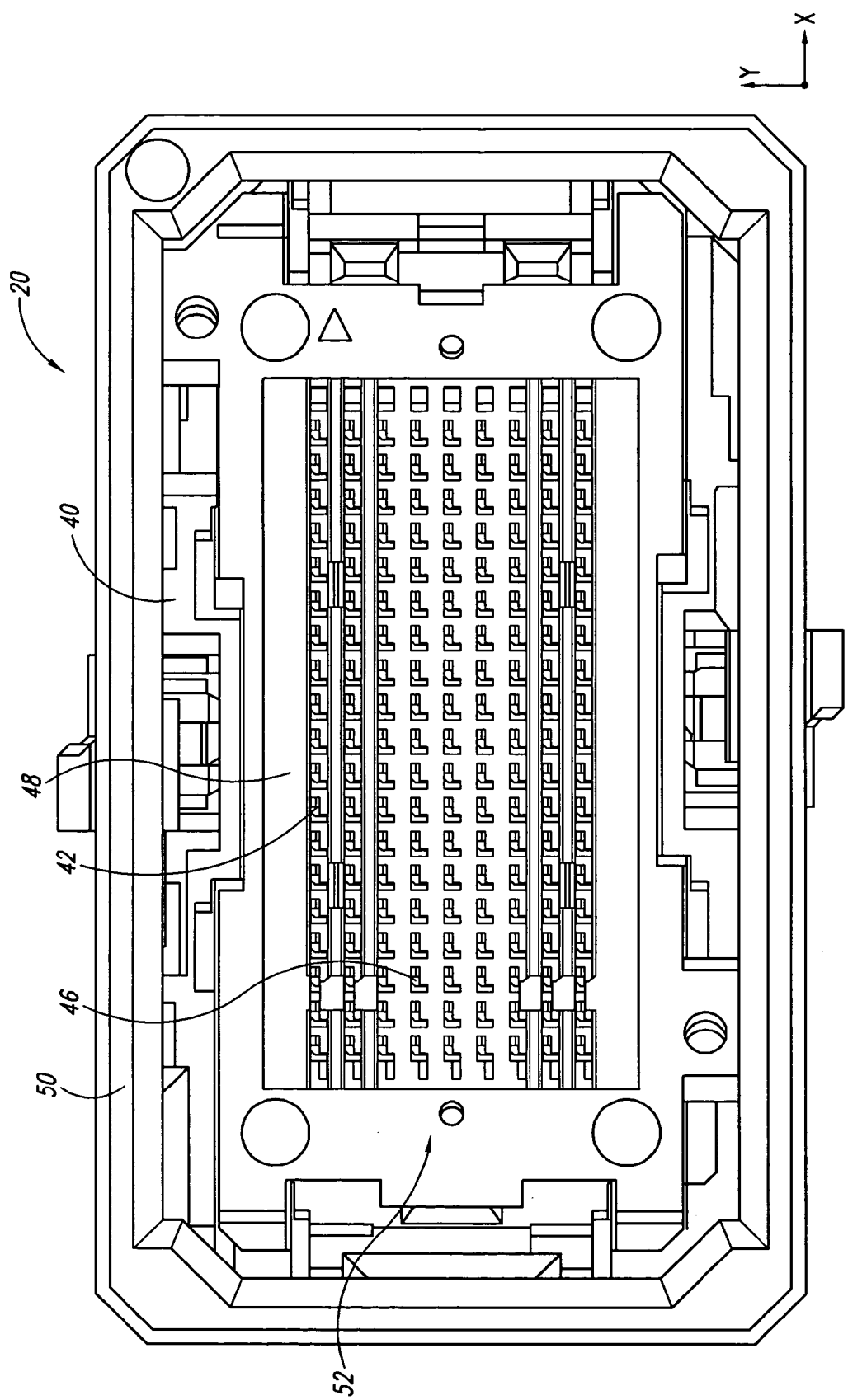
FIG. 4 is a top plan view of the socket of FIG. 2.

FIG. 3 is an enlarged side elevation view of one of the sockets 20 of FIG. 1, and FIG. 4 is a top plan view of the socket 20 of FIG. 3. The socket 20 of the illustrated embodiment includes a base 40 and a lead array having a plurality of electrically conductive leads 42 connected to circuitry 44 in the printed circuit board 22 (FIG. 3). The leads 42 extend upwardly through the base 40 and protrude through apertures 46 (FIG. 4) formed in a slider 48 movably mounted to the base 40. The leads 42 can be arranged in an array that corresponds to the ball-grid array 36 on a packaged device 12 (shown in phantom lines) that is to be tested in the socket 20. The array of leads 42 is configured to removably connect individual leads 42 to individual solder balls of the ball-grid array 36 when the packaged device 12 is properly positioned in the socket 20.

The socket 20 includes a spring-loaded cover 50 movably connected to the base 40 to define a receiving area 52 relative to the slider 48 and the array of leads 42. The receiving area 52 in the socket 20 is shaped and sized to removably receive a portion of the placement head 26 (FIG. 1) as a packaged device is loaded into the socket 20. As explained below, the same socket 20 can be used to test a plurality of different packaged devices having the same ball-grid array configuration but different profiles. The sockets 20 are accordingly substantially independent of the package profiles.

Figure 5:
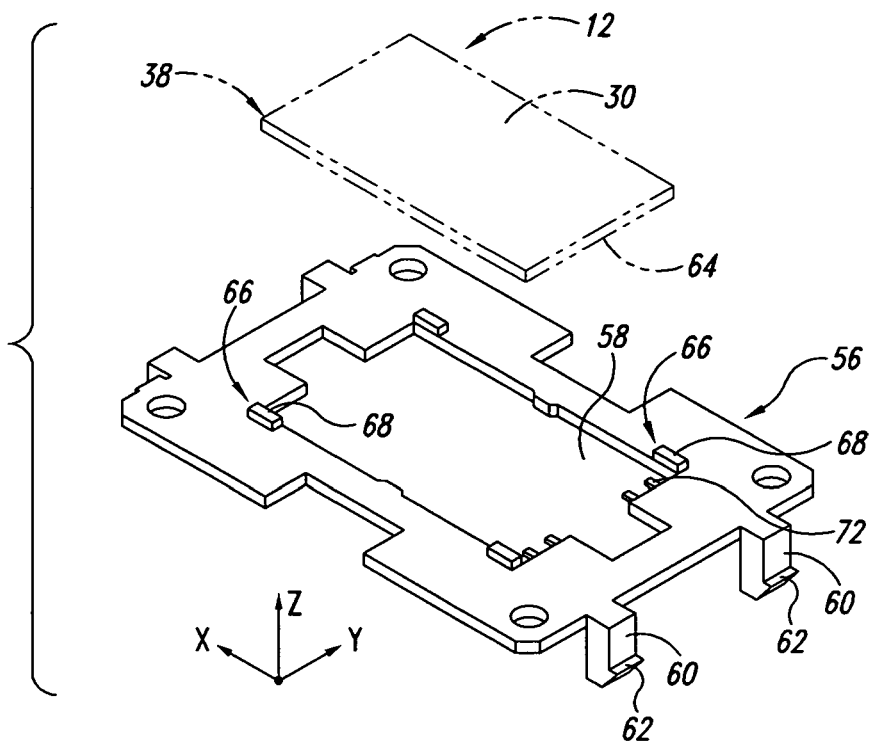
FIG. 5 is a top isometric view of a guide positionable in the socket of FIG. 4.
Figure 6:
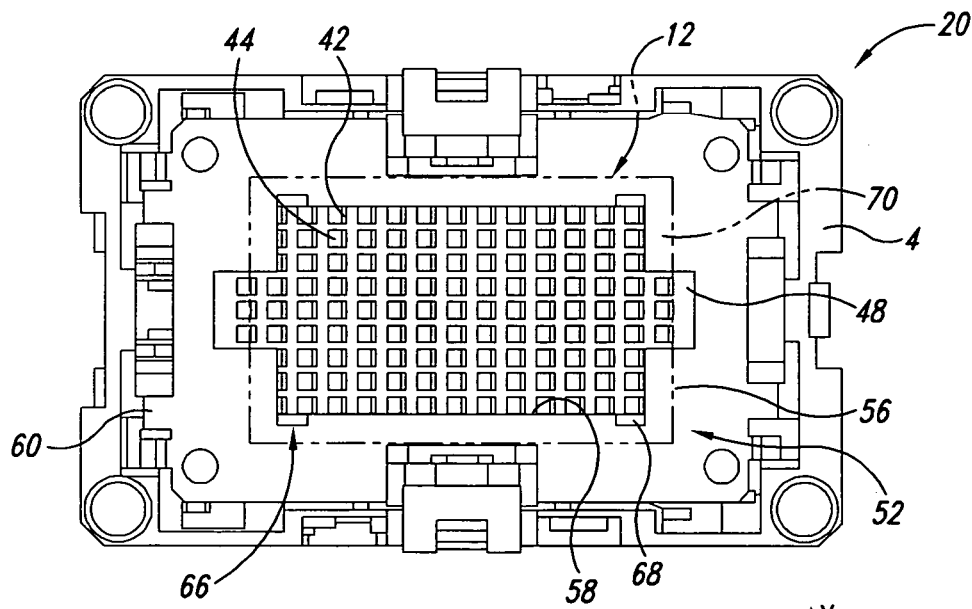
FIG. 6 is a top plan view of the guide of FIG. 5 shown installed in the socket of FIG. 4.

The socket 20 shown in FIGS. 3 and 4 does not have a conventional nest in the receiving area 52. As explained above in the background section, a conventional nest holds the packaged device in the socket in a manner that protects the solder balls from being damaged and aligns the solder balls with corresponding leads of the socket. The testing system 10 shown in FIG. 1 protects the solder balls and aligns the solder balls with the leads without a nest by (a) providing a guide that protects the solder balls of packaged devices irrespective of the package profile and (b) aligning the solder balls with leads using the placement heads 26 (FIG. 1). FIGS. 5–9 describe several embodiments of the guides that are removably attachable to the sockets 20 for protecting the solder balls from being damaged as they contact the leads 42 (FIG. 6). FIGS. 10–13 then describe several embodiments of placement heads that align the packaged devices with the sockets 20 so that the solder balls contact the correct leads.

The solder balls in the ball-grid array 36 are very fragile and must be precisely placed in the socket 20 relative to the slider 48 and the array of leads 42 to avoid damaging the packaged device 12. FIG. 5 is a top isometric view of a guide 56, and FIG. 6 is a top plan view of the socket 20 with the guide 56 positioned within the receiving area 52 adjacent to the slider 48. The guide 56 of the illustrated embodiment is configured to position and support the packaged device 12 at a selected position away from the slider 48 (FIG. 6). In one embodiment, the guide 56 is removably connected to the socket 20 (FIG. 6), and in other embodiments the guide may be integrally connected to the socket. The guide 56 provides a surface plane to register the packaged device 12 relative to the leads 42.

The guide 56 of the illustrated embodiment is a generally planar member having a central aperture 58 shaped and sized to extend around the array of leads 42 (FIG. 6). The aperture 58 is also shaped and sized to receive the ball-grid array 36 (FIG. 2) when the packaged device 12 is positioned in the socket 20. In one embodiment, the aperture 58 is shaped to closely correspond to the outline of the ball-grid array. Accordingly, the guide 56 and the corresponding socket 20 are keyed to the ball-grid array rather than being keyed to the package profile of the packaged device. The guide 56 also has projections 68 projecting upwardly from the top surface. The projections 68 are arranged to support the packaged device in a specific plane relative to the socket 20 when the guide 56 is attached to the socket 20. Additional aspects of the projections are described below regarding FIG. 8.

As best seen in FIGS. 5 and 6, the guide 56 of the illustrated embodiment includes a plurality of retention members 60 that removably retain the guide in the receiving area 52 of the socket 20 at a desired position relative to the array of leads 42. The retention members 60 of the illustrated embodiment have hook portions 62 (FIG. 5) that engage the base 40 and securely retain the guide 56 in a fixed position relative to the base. The retention members 60 are configured so the slider 48 can translate laterally (i.e., left-right in FIG. 6) relative to the base 40 and the leads 42 when the spring-loaded cover 50 is depressed relative to the base 40. While the illustrated embodiment has retention members 60 with hook portions 62, other embodiments can use other retention devices that removably retain the guide 56 in the receiving area 52. Accordingly, the guide 56 can be removed and replaced in the event a guide is damaged or if the socket 20 is to be used for testing packaged devices with different ball-grid arrays that require a different shaped or sized guide 56.

Figure 7:
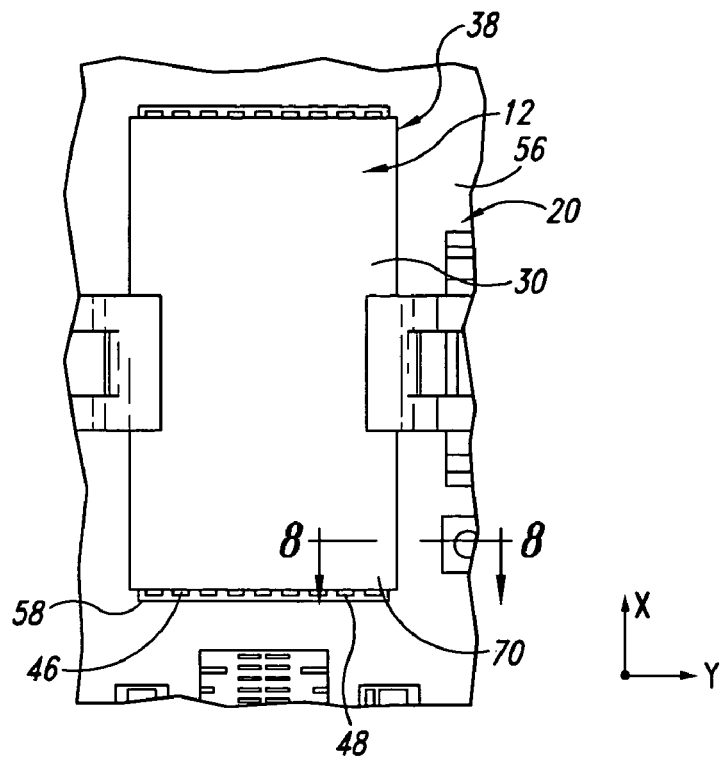
FIG. 7 is an enlarged top plan view of the packaged device shown installed in the socket of FIG. 4 and positioned on the guide of FIG. 5.

FIG. 7 is a top plan view of the socket 20 with the packaged device 12 positioned in the receiving area 52 (FIG. 6) and supported above the array of leads 42 (FIG. 6) by the guide 56. As best seen in FIG. 7, the package profile 38 of the packaged device 12 is spaced apart from the outermost edges of the guide 56 and the slider 48 when the packaged device is positioned within the receiving area 52. The same socket 20 and guide 56 can be used to removably retain a plurality of different packaged devices with substantially identical ball-grid arrays 36 but different profiles. The leads 42 can also be part of a universal array that can be selectively configured to work with different ball-grid arrays. The socket 20 and guide 56 are very versatile such that the same burn-in board 18 (FIG. 1) can be used to burn-in a plurality of different packaged devices 12 without having to reconfigure each of the 256 sockets on the burn-in board when the profile of the packaged devices changes.

Figure 8:
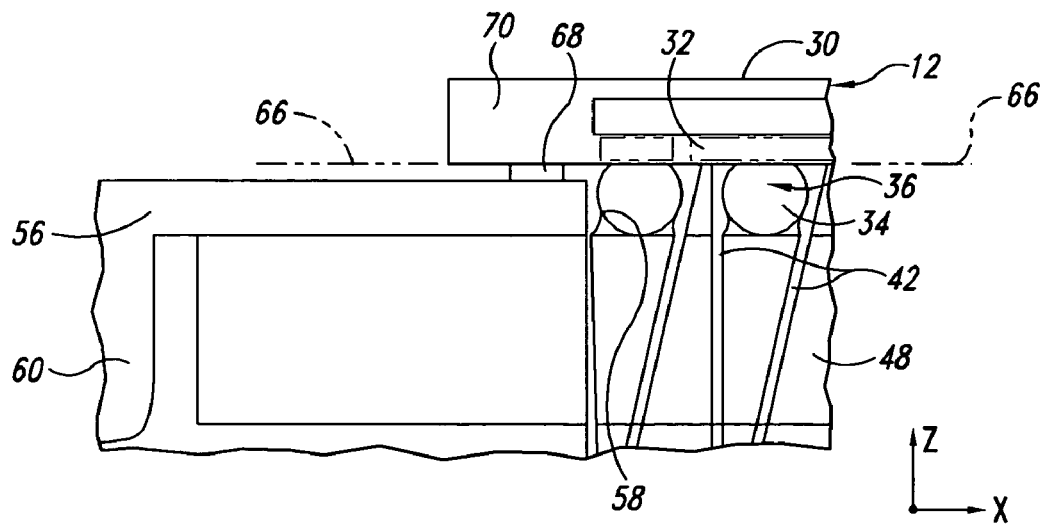
FIG. 8 is an enlarged cross-sectional view taken substantially along line 8—8 of FIG. 7 showing a portion of the packaged device in the socket and on the guide.

FIG. 8 is an enlarged cross-sectional view taken substantially along line 8—8 of FIG. 7 showing a portion of the packaged device 12 in the socket 20 and supported on the guide 56. The guide 56 of the illustrated embodiment extends under an edge portion 70 of the packaged device 12. The projections 68 of the guide 56 of the illustrated embodiment contact the packaged device 12 at discrete points to support the packaged device 12 in a reference plane 66 (in FIG. 8) spaced apart from the leads 42. The top surfaces of the projections 68 together define the reference plane 66, and they are positioned to support edge portions 70 of the packaged device 12. The projections 68 can be any of a variety of shapes, including, as only a few examples, rectangular, triangular, or partial spherical.

The projections 68 of the illustrated embodiment are the only parts of the guide 56 that physically touch the packaged device 12. Accordingly, surface defects that may occur on the guide 56 or the packaged devices 12 during manufacturing are less likely to negatively impact the ability of the guide 56 to properly position the packaged device 12 at the desired distance above the leads 42. In addition, the guide 56 with the projections 68 has the added benefit of allowing any overall bow in the packaged device 12 to be less critical or sensitive in terms of affecting where the leads 42 reference the solder balls along the Z-axis.

While the illustrated embodiment includes a guide 56 as a separate and removable structure from the socket 12, other embodiments can include a guide 56 integrally formed with the slider 48 adjacent to the array of electric leads. The integrally formed guide 56 is carefully sized for selected packaged devices 12 so that the ball-grid arrays 36 are properly positioned relative to the leads 42. Accordingly, the guide need not be separate from the socket. In another embodiment, the guide 56 can be formed partially on the packaged device 12 and partially on the base 40 of the socket 20. In yet another embodiment, the guide 56 is integrally formed solely on the packaged device 12. In this alternate embodiment, the guide 56 supports the packaged device 12 at the desired distance from the slider 48 when in the socket 20, but the guide is also configured so it does not interfere with the mounting of the packaged device on an end product, such as a printed circuit board for an electronic device.

In some instances during burn-in testing of the packaged devices 12, the heat and/or other conditions of the test may result in some of the solder balls 34 sticking to the leads 42 or to a portion of the slider 48. As a result, the packaged device 12 can be accidentally damaged during removal from the socket 20.

Figure 9:
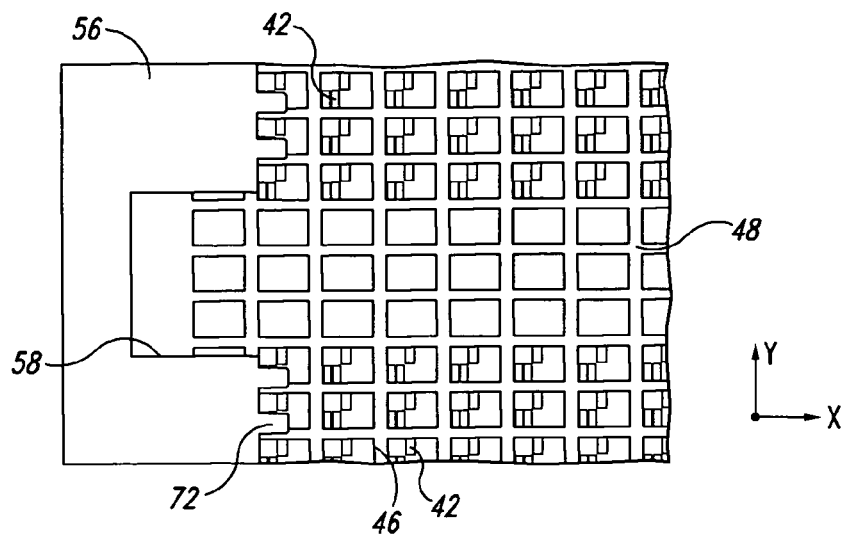
FIG. 9 is an enlarged partial plan view of the socket and the guide of FIG. 6 positioned adjacent to an array of electric leads in the socket.

FIG. 9 is an enlarged partial top plan view of the slider 48 and a portion of the guide 56 adjacent to the array of leads 42. The guide 56 includes a plurality of anti-stick members 72 positioned to engage the packaged device 12 to detach the solder balls 34 (FIG. 8) from the leads 42 before the packaged device is removed from the socket 20. The anti-stick members 72 of the illustrated embodiment are projections that extend laterally toward the leads 42, generally parallel to the top surface of the slider 48. Accordingly, as the slider 48 moves laterally relative to the anti-stick members 72 during the process of removing the packaged device 12 (FIG. 8) from the socket 20, the anti-stick members 72 prevent the packaged device 12 (FIG. 8) from translating laterally with the slider 38. The leads 42 can accordingly move apart fully disengage the solder balls 34 (FIG. 8). The packaged device 12 can then be lifted from the socket 20 without damaging the ball-grid array 36.

As indicated above, the guide 56 of the illustrated embodiment aligns the packaged device 12 in a selected position along one axis (i.e., the Z-axis) relative to the leads 42 when the packaged device 12 is loaded into the socket 20. The socket 20 of this illustrated embodiment, however, does not have a nest to align the packaged device 12 along the X-axis and Y-axis relative to the leads 42. Alignment along the X-axis and Y-axis is accomplished by the package handling assembly 24 as shown in FIGS. 10–13.

Figure 10:
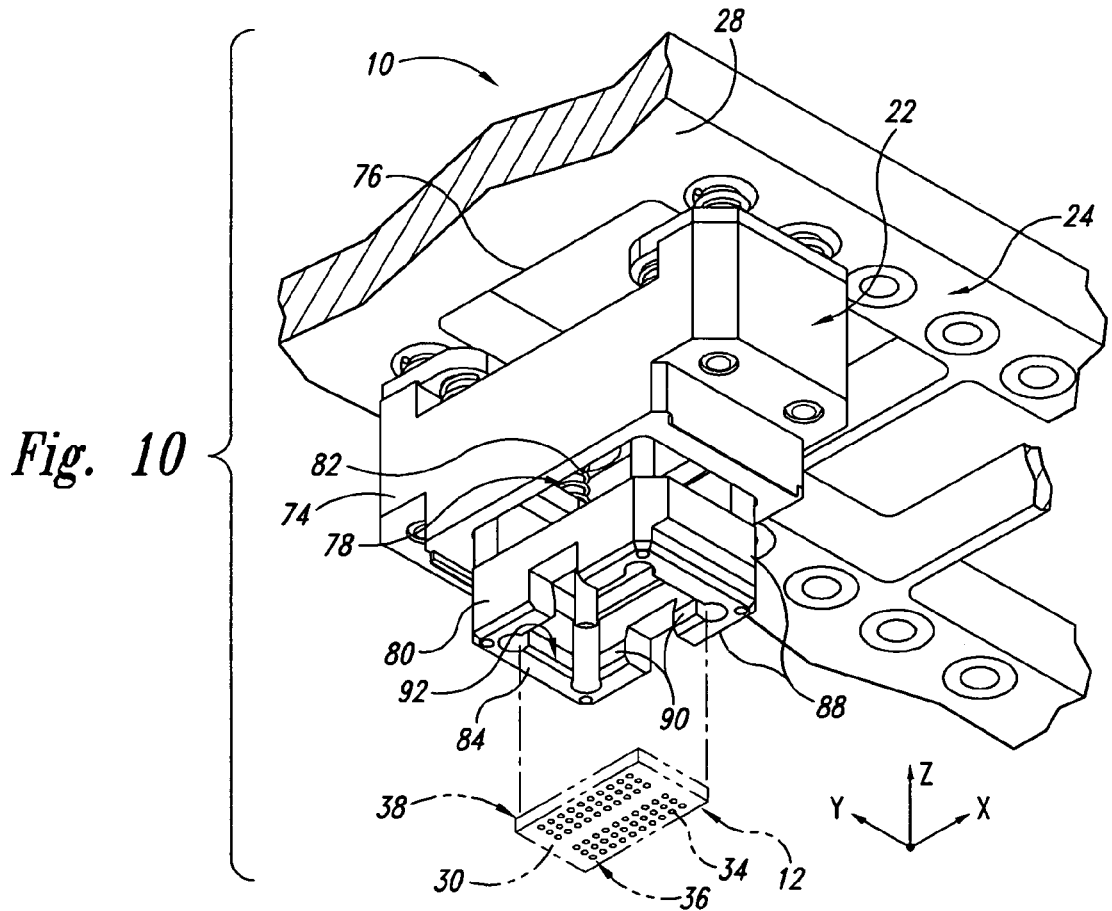
FIG. 10 is an enlarged bottom isometric view of a package handling assembly with a placement head under one configuration of the testing system of FIG. 1.
Figure 11:
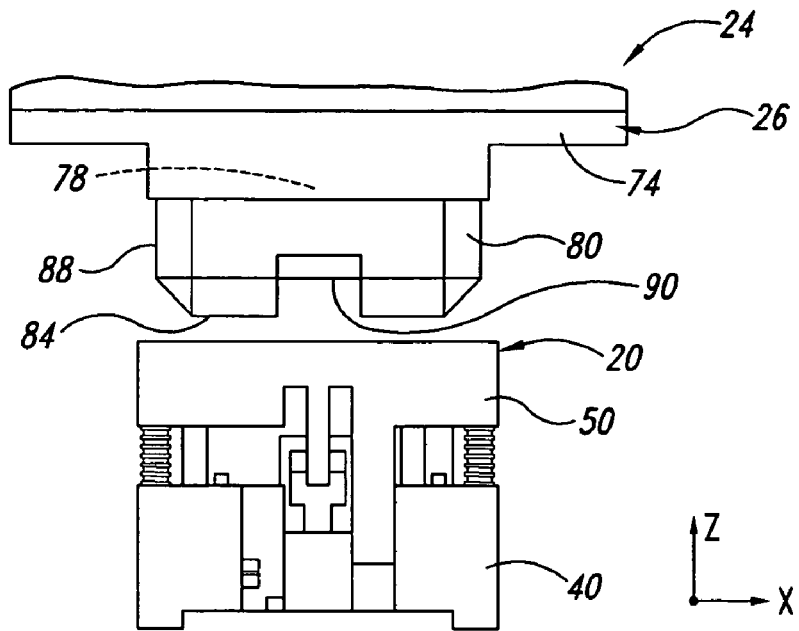
FIG. 11 is an enlarged side elevation view of the placement head of FIG. 10 shown spaced above the socket of FIG. 3.
Figure 12:
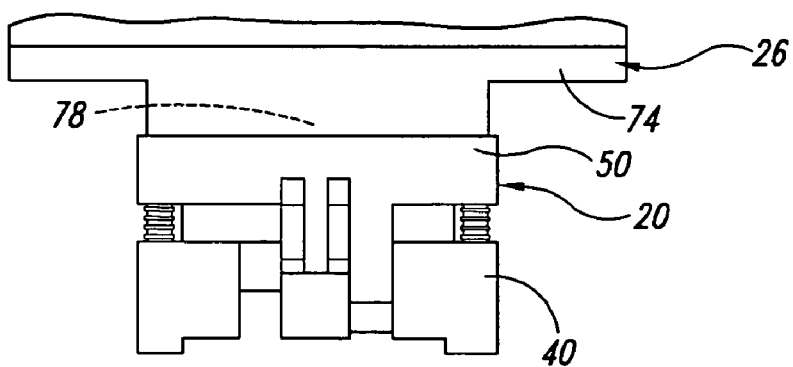
FIG. 12 is an enlarged side elevation view of the placement head positioned in engagement with the socket of FIG. 3.

FIG. 10 is an enlarged bottom isometric view of an embodiment of a portion of the package handling assembly 24 of FIG. 1 with the placement head 26 mounted on the support bar 28. FIG. 11 is a side elevation view of an alternate embodiment of the placement head 26 spaced above the socket 20. FIG. 12 is a side elevation view of the placement head 26 pressed into engagement with the socket 20. The placement head 26 is configured to direct the packaged device 12 (shown in phantom lines) into and out of the socket 20 (FIGS. 11 and 12) while maintaining the required alignment of the packaged device along the X-axis and Y-axis relative to the socket 20.

Referring primarily to FIG. 10, the placement head 26 of the illustrated embodiment includes a fixture 74 removably connected to the elongated support bar 28 proximate to an enlarged aperture 76 in the support bar 28. The fixture 74 also has an aperture 78 aligned with the aperture 76 in the support bar 28. The apertures 76 and 78 are shaped and sized to allow, as one example, a portion of the vacuum pick-and-place system 29 (FIG. 1) and a packaged device 12 to pass through the support bar 28.

The placement head 26 includes an alignment element 80 movably connected to the fixture 74 and axially aligned with the apertures 76 and 78. In the illustrated embodiment, the alignment element 80 is connected to springs 82 that allow the alignment element 80 to move axially relative to the fixture 74. The alignment element 80 fits into the receiving area 52 (FIG. 4) in the socket 20 (FIG. 4) to provide precise placement of the alignment element 80 relative to the array of leads 42 (FIG. 4) when a packaged device 12 is being loaded into the socket. For example, the alignment element 80 includes outer guide surfaces 88 that nest with the cover 50 of the socket 20 when the alignment element 80 is positioned in the receiving area 52. The outer guide surfaces 88 accurately position the alignment element 80 within the socket 20 laterally (i.e., along the X-axis and Y-axis) relative to the guide 56 (FIG. 6) and the array of electrical leads 42. The alignment element 80 can have a substantially flat bottom surface 84 that fits into the receiving area 52 in the test socket 20 and presses against the guide 56 (FIG. 6) when the packaged device 12 is being inserted into the socket. The alignment element 80 of the illustrated embodiment is a generally rectangular member with a flat bottom surface, but the alignment element can have other shapes and configurations that still provide the relative alignment along the X-axis and Y-axis in other embodiments.

The alignment element 80 of the illustrated embodiment also includes interior guide surface 90 specifically positioned and sized to correspond to the package profile 38 of the packaged device 12. The interior guide surfaces 90 are configured to receive a packaged device 12 and accurately retain the packaged device in a selected position along the X-axis and Y-axis relative to the array of leads 42 in the socket 20. The interior guide surfaces 90 align the packaged device 12 such that, when the packaged device is separated from the pick-and-place head and drops across the small gap (as discussed above) onto the guide 56 in the testing socket, the packaged device remains precisely aligned along the X-axis and Y-axis. In the illustrated embodiment, the interior guide surfaces 90 include beveled portions that are inclined inwardly and downwardly to provide a wider opening in the alignment element adjacent to the fixture 74 and a narrower opening 92 at the bottom surface 84 to align a packaged device 12 as it moves downwardly through the alignment element. Accordingly, the alignment element 80 positions the packaged device 12 in the X-axis and Y-axis for proper positioning of the ball-grid array (FIG. 2) in direct alignment with the leads 42.

In the embodiment illustrated in FIG. 10, the springs 82 urge the alignment element 80 away from the fixture 74. When the alignment element 80 is pressed into engagement with the guide 56 in the socket 20 (FIG. 6), the springs 82 are compressed and bias the alignment element against the guide 56. As the placement head 26 starts to lift away from the testing socket 20, the springs 82 keep the alignment element 80 in engagement with the guide 56 until the springs return to their uncompressed position. Also, as the placement head 26 starts to lift away from the testing socket 20, the fixture 74 lifts relative to the guide 56 and causes clamp members in the testing socket to engage and hold the packaged device 12 in place against the guide 56. Accordingly, the biased alignment element 80 keeps the packaged device 12 in alignment in the testing socket 20 until the clamps in the testing socket 20 can secure the packaged device 12 in place, thereby preventing the packaged device's ball grid array 36 from being knocked out engagement with the leads 42 (FIG. 8). The placement head 26 is configured so that, after the clamps in the socket 20 have secured the packaged device 12 with the socket 20, the alignment element 80 is lifted with the fixture 74 away from the testing socket leaving the packaged device precisely aligned in the socket.

In an alternate embodiment shown in FIG. 11, the fixture 74 and the alignment element 80 and rigidly connected together. In this embodiment, the alignment element 80 is lifted away from the guide 56 (FIG. 6) at the same time the fixture 74 is lifted from the testing socket 20. As the alignment element 80 is lifted from the guide 56, the clamps in the testing socket simultaneously secure the packaged device 12 in place to prevent the ball grid array 36 from being knocked out of engagement with the leads 42 in the testing socket 20.

The package handling assembly 24 can be set up with an array of placement heads 26 having alignment elements 80 configured for a selected package profile 38 (shown in phantom). The package handling assembly 24 can then be used to accurately place the packaged devices 12 in precise positions relative to the X-axis and Y-axis into the sockets 20. After the packaged device 12 is properly loaded in the socket 20, the alignment element 80 is removed from the socket 20 so that when the package handling assembly 24 lifts the placement heads 26 away from the sockets. The loaded packaged device 12 is left in position in the socket 20 and ready for the burn-in testing.

After the alignment element 80 is removed, the area around the packaged device 12 is fairly open and allows for air flow around the packaged device, particularly during the burn-in testing. The airflow around the packaged device 12 provides improved thermal impedance and heat transfer away from the packaged device and the test socket 20. The airflow also results in reduced heat gradients between the packaged device 12 and primary air streams provided in a conventional burn-in oven.

In the event that the package handling assembly 24 needs to be reconfigured to handle packaged devices 12 with a different package profile 38, the placement heads 24 can be easily removed and replaced by new placement heads with alignment elements 80 shaped and sized for the selected package profile. In an alternate embodiment, the placement heads 26 can be reconfigured to remove and replace the alignment elements 80 with other alignment elements configured for the selected package profile. Once the placement heads 26 or alignment elements 80 are reconfigured, the new placement heads 26 can be used with the same 256 sockets 20 on the burn-in board 18 without having to reconfigure each and every one of those sockets. As a result, the burn-in testing of packaged devices 12 with common ball-grid arrays 36 but different package profiles can be accomplished much more efficiently.

Figure 13:
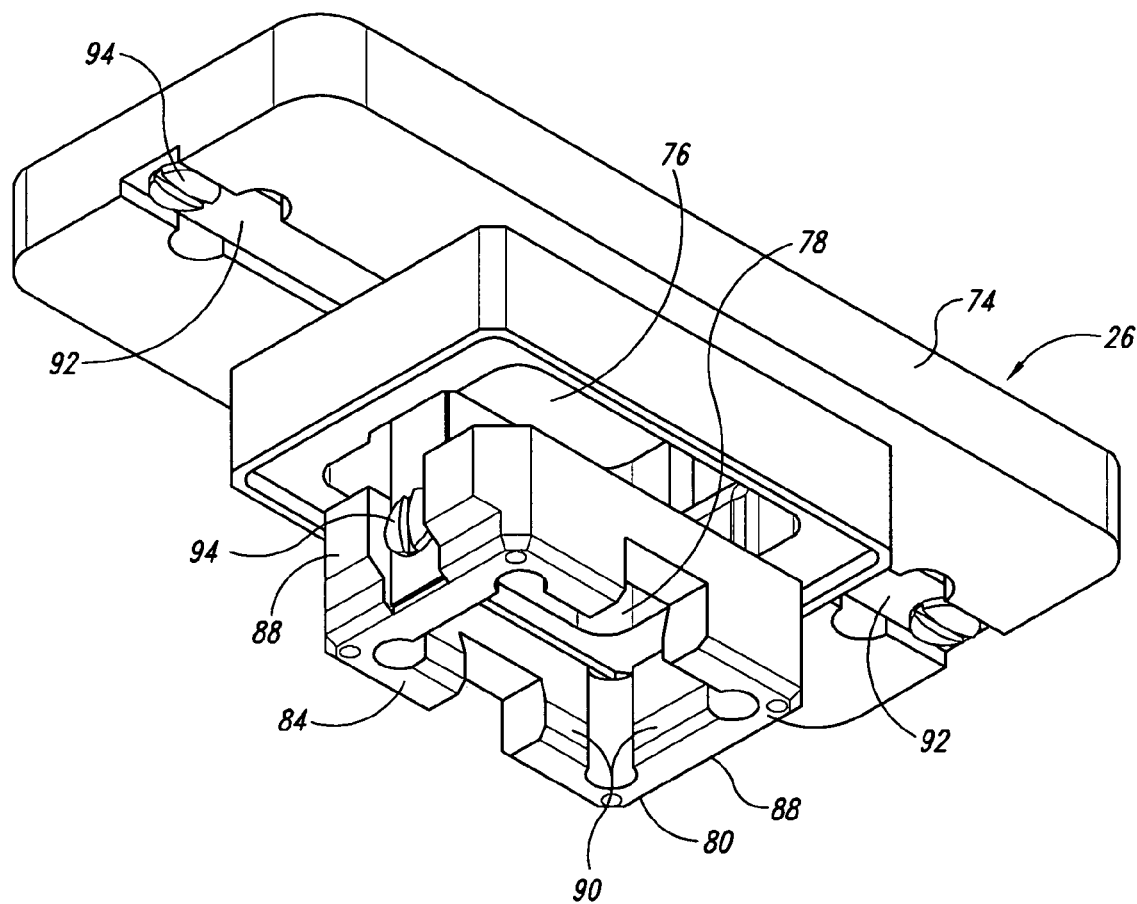
FIG. 13 is an isometric view of an alternate embodiment of a placement head shown removed from the package handling assembly of FIG. 1.

FIG. 13 is an enlarged isometric view of an alternate embodiment of the placement head 26 and alignment element 80. In this alternate embodiment, the alignment element 80 is movably coupled to the fixture 74 by a pair of spring arms 92. The spring arms 92 allow the alignment element 80 to move axially relative to the aperture 78 in the fixture 74 when the alignment element is pressed into engagement with the socket 20 (FIG. 3). The spring arms 92 are connected to the alignment element 80 and to the fixture 74 by conventional fasteners 94 so the alignment head can be easily removed and replaced.

From the foregoing, it will be appreciated that specific embodiments of the invention have been described herein for purposes of illustration, but that various modifications may be made without deviating from the spirit and scope of the invention. For example, the placement head 26 of the illustrated embodiments is shown mounted on an automated package handling assembly 24. In an alternate embodiment, the placement head 26 can be installed on a hand tool used for individually placing selected packaged devices 12 in sockets 20 for selected tests or analysis. Accordingly, the invention is not limited except as by the appended claims.

I claim:

1. A testing system for testing a packaged microfeature device having a profile and an array of electrical contacts, comprising:

a socket carried by a circuit board and having an array of leads configured to contact the array of contacts on the packaged device at a reference plane; and a package handling assembly having a placement head and an alignment element coupled to the placement head, the placement head being moveable between a first position at which the alignment element is separated from the socket and a second position at which the alignment element is proximate to the array of leads of the socket, the placement head being configured so that the packaged device can pass through the placement head when the placement head is in the second position, the alignment element having an alignment portion configured to guide lateral movement of the packaged device in the reference plane relative to the array of leads.

2. The system of claim 1 wherein the alignment portion comprises a channel having projections sized and shaped to engage a perimeter of the packaged device.

3. The system of claim 1 wherein the alignment element has sidewalls defining an alignment aperture through which the packaged device can pass along a load/unload path, and wherein the sidewalls are configured to restrict movement of the packaged device lateral to the load/unload path.

4. The system of claim 1 wherein the alignment element comprises a tapered chamber having inclined sidewalls that slope inwardly and downwardly.

5. The system of claim 1 wherein the alignment element is detachable from the placement head.

6. The system of claim 1 wherein the package handling assembly and the socket are movable in at least three dimensions relative to each other.

7. The system of claim 1 wherein the package handling assembly is an automated assembly.

8. The system of claim 1 wherein the alignment element is a first alignment element, and further comprising a second alignment element interchangeable with the first alignment element on the package handling device, the second alignment element having a second alignment portion configured to receive a second packaged device having a profile different than the first packaged device in a manner that guides lateral movement of the second packaged device relative to the array of leads.

9. The system of claim 1 wherein the socket is a first socket, and further comprising a plurality of other sockets connected to the testing substrate and substantially identical to the first socket, the alignment element being positionable in the receiving areas of the plurality of other sockets.

10. The system of claim 1, further comprising guide connected to the socket in the receiving area, the guide positioned to support the packaged device a fixed distance from the array of leads.

11. The system of claim 1, further comprising a guide plate connected to the socket adjacent to the array of leads and positioned to support the packaged device a fixed distance from the array of leads.

12. A system for testing a plurality of packaged microfeature devices having electrical contacts the packaged devices having at least one of a plurality of profiles, comprising:
a plurality of sockets arranged in a socket array, wherein individual sockets have an array of leads coupleable to the array of contacts on the packaged devices, at least one of the sockets being a first socket having a receiving area proximate to the array of leads and configured to removably receive a respective packaged device independent of the package profile of the packaged device; and
a package handling assembly having a support member and a plurality of alignment elements carried by the support member, at least one of the alignment elements being a first alignment element that is moveable with the support member as a unit relative to the first socket to be positioned in the receiving area of the first socket, the first alignment element having portions configured to restrict movement of a packaged device in at least two dimensions relative to the first socket when the packaged device is positioned in the receiving area.

13. The system of claim 12 wherein the first alignment element is removably connected to the support member.

14. The system of claim 12 wherein the first alignment element has sidewalls that define an alignment aperture corresponding to the one of the package profiles.

15. The system of claim 12 wherein the package handling assembly and the plurality of sockets are movable in at least three dimensions relative to each other.

16. The system of claim 12 wherein the package handling assembly is an automated assembly.

17. A testing system for testing a packaged microfeature device having a profile and an array of contacts, comprising:
a socket having an array of leads configured to contact the array of contacts on the packaged device at a reference plane; and
a package handling assembly having a placement head and an alignment element coupled to the placement head, the placement head and alignment element being moveable relative to the socket, the alignment element having an aperture therethrough with internal tapered bearing surfaces terminating at an opening and configured to align the array of contacts of the packaged device with the array of leads in the socket.

18. The system of claim 17 wherein the alignment element has external bearing surfaces configured to align the alignment element relative to the array of leads.

19. The system of claim 17 wherein the internal tapered bearing surface slope inwardly and downwardly.

20. The system of claim 17 wherein the alignment element is detachable from the placement head.

21. The system of claim 17 wherein the alignment element is a first alignment element, and further comprising a second alignment element interchangeable with the first alignment element on the package handling device, the second alignment element having a second alignment portion configured to receive a second packaged device having a profile different than the first packaged device in a manner that guides lateral movement of the second packaged device relative to the array of leads.

22. A testing system for testing a packaged microfeature device having a profile and an array of electrical contacts, comprising:
a means for testing the packaged device, the means for testing having an array of engagement means for contacting the array of contacts on the packaged device at a reference plane; and
a handling means for handling packaged devices, the handling means having a placement means and a means for aligning the packaged device laterally relative to the reference plane, the placement means being moveable between a first position at which the means for aligning is separated from the means for testing and a second position at which the means for aligning is proximate to the array of engagement means of the means for testing, the placement means being configured so that the packaged device can pass through the placement means when the placement means is in the second position, the means for aligning configured to guide lateral movement of the packaged device in the reference plane relative to the array of engagement means.

23. The system of claim 22 wherein the means for aligning comprises a channel having means to support the packaged device, the means to support being sized and shaped to engage a perimeter portion of the packaged device.

24. The system of claim 22 wherein the means for aligning has bearing surfaces that allow movement of the packaged device along a load/unload path and configured to restrict movement of the packaged device lateral to the load/unload path.

25. The system of claim 22 wherein the means for aligning is detachable from the placement means.

26. The system of claim 22 wherein the handling means and the testing means are movable in at least three dimensions relative to each other.

27. A testing system for a packaged microfeature device having a profile and an array of electrical contacts, comprising:
   a socket carried by a testing substrate and having an array of leads coupleable to the array of contacts and a receiving area proximate to the array of leads that is configured to removably receive the packaged device therein;
   a surface guide coupled to at least one of the socket and the packaged device, the surface guide positioned to support at least a portion of the packaged device apart from the array of leads, with the array of contacts in alignment with the array of leads; and
   a package handling assembly movable between a load position and a release position relative to the socket, the package handling assembly having a placement head and an alignment element coupled to the placement head, the placement head being configured so that the packaged device can pass through the placement head when the placement head is in the load position, an alignment element configured to contact a perimeter edge of the packaged device in a manner that aligns the contacts with corresponding leads at the receiving area in at least two dimensions relative to the socket.

28. The system of claim 27 wherein the surface guide is removably connected to the socket.

29. The system of claim 27 wherein the surface guide is integral with a component of the socket.

30. The system of claim 27 wherein the surface guide includes an aperture therein sized receive the array of contacts independent of the package profile.

31. The system of claim 27 wherein the receiving area of the socket is sized to receive the packaged device therein with the array of contacts in direct alignment with the array of leads independent of the package profile of the body.

32. The system of claim 27 wherein the alignment element is shaped and sized to at least substantially correspond to the package profile of the body.

33. The system of claim 27 wherein the alignment element has sidewalls defining an alignment aperture through which the packaged device can pass along a load/unload path, and wherein the sidewalls are configured to restrict movement of the packaged device lateral to the load/unload path.

34. The system of claim 27 wherein package handling assembly has a support member and the alignment element is removably coupled to the support member.

35. The system of claim 27 wherein the alignment element comprises a tapered chamber having inclined sidewalls that slope inwardly and downwardly.

36. The system of claim 27 wherein the package handling assembly is an automated assembly.

37. The system of claim 27 wherein the alignment element is a first alignment, and further comprising a second alignment element interchangeable with the first alignment element on the package handling device, the second alignment element having a second alignment portion configured to receive a second packaged device having a profile different than the first packaged device in a manner that guides lateral movement of the second packaged device in the reference plane relative to the array of leads.

38. The system of claim 27 wherein the socket is a first socket, and further comprising a plurality of other sockets connected to the testing substrate and substantially identical to the first socket, the alignment element being positionable in the receiving areas of the plurality of other sockets.

39. A packaged device testing system for testing first and second packaged devices, the first packaged device having a first array of contacts and having a first package profile, and the second packaged device having a second array of contacts substantially the same as the first array of contacts and having a second package profile different than the first package profile, comprising:
   a socket having an array of leads arranged to be electrically coupleable with the first and second array of contacts, the socket having a receiving area adjacent to the array of leads and configured to removably receive the first and second packaged devices; and
   a surface guide coupled to the socket and positioned to support at least a portion of one of the first and second packaged devices apart from the array of leads with the array of leads being in alignment with one of the first and second array of contacts, independent of the first and second package profile.

40. The system of claim 39 wherein the array of leads are configured to contact the first or second array of contacts at a reference plane, and further comprising a package handling assembly having a placement head and an alignment element coupled to the placement head, the placement head being moveable between a first position at which the alignment element is separated from the socket and a second position at which the alignment element is proximate to the array of leads of the socket, the alignment element having an alignment portion configured to guide lateral movement of the first or second packaged devices in the reference plane relative to the array of leads.

41. The system of claim 39, further comprising a package handling assembly movable relative to the socket, the package handling assembly having an alignment element positionable in the receiving area of the socket, the alignment element restricting lateral movement of the first or second package profiles in at least two dimensions relative to the socket.

42. The system of claim 39 wherein the array of leads are configured to contact the first or second contacts at a reference plane, and further comprising:
   a first alignment element shaped to receive the first packaged device and being positionable in the receiving area of the socket, the first alignment element configured to guide lateral movement of the first packaged device in the reference plane relative to the array of leads; and
   a second alignment element shaped to receive the second packaged device and being positionable in the receiving area of the socket, the second alignment configured to guide lateral movement of the second packaged device in the reference plane relative to the array of leads.

43. The system of claim 39 wherein the surface guide is removably connected to the socket.

44. The system of claim 39 wherein the surface guide includes an aperture sized to independently receive the first and second arrays of contacts independent of the first and second package profiles.

45. The system of claim 39 wherein the surface guide includes at least one engagement member positioned to temporarily engage at least one of the first and second arrays of contacts during removal of the respective first or second packaged devices from the socket.

46. The system of claim 39 wherein the receiving area of the socket is sized to independently receive the first and second packaged devices therein with the respective first and second arrays of contacts in direct alignment with the array of leads independent of the first and second package profiles.

47. The system of claim 39 wherein the socket is a first socket, and further comprising a plurality of other sockets substantially identical to the first socket.

48. A packaged device testing apparatus for testing first and second packaged devices having commonly arranged arrays of contacts, the first packaged device having a first package profile and the second packaged device having a second package profile different from the first package profile, comprising:
   a socket having an array of leads arranged to be coupleable with the commonly arranged array of contacts, the socket having a receiving area adjacent to the array of leads and configured to removably receive the first and second packaged devices independent of the first and second package profiles; and
   a surface guide coupled to the socket and positioned to engage a respective one of the first and second packaged devices independent of the first and second package profiles and to support at least a portion of the respective one of the first and second packaged devices away from the array of leads with the array of leads being in direct alignment with the array of contacts of the respective one of the first and second packaged devices.

49. The apparatus of claim 48 wherein the surface guide is removably connected to the socket.

50. The apparatus of claim 48 wherein the surface guide has a retention member releasably engaging the socket and retaining the surface guide in a substantially fixed position on the socket.

51. The apparatus of claim 48 wherein the surface guide is integrally connected to the socket.

52. The apparatus of claim 48 wherein the surface guide includes an aperture therein sized to independently receive the array of contacts of the first and second packaged devices independent of the first and second package profiles.

53. The apparatus of claim 48 wherein the surface guide includes at least one engagement member positioned to block at least one of the first and second packaged devices from moving laterally relative to the receiving area.

54. A method of testing a packaged device having an array of contacts and a package profile, comprising:
   positioning an alignment element in a socket having an array of leads couplable to the array of contacts at a reference plane;
   positioning the packaged device in the alignment element with the array of contacts of the packaged device in alignment with an array of leads in the socket;
   restricting lateral movement of the packaged device relative to the reference plane;
   connecting the packaged device to the socket with the array of contacts coupled to the array of leads;
   removing the alignment element from the socket without removing the packaged device from the socket; and
   testing the packaged device in the socket.

55. The method of claim 54, further comprising positioning a body of the packaged device apart from the array of leads along an axis normal to the reference plane when the packaged device is connected to the socket.

56. The method of claim 54 wherein testing includes burn-in testing of the packaged device.

57. The method of claim 54 wherein positioning a packaged device includes positioning the packaged device in a placement head of an automated package handling system.

58. The method of claim 54, further comprising positioning a surface guide on the socket adjacent to the array of leads before the alignment element and packaged device are positioned as a unit in the socket, and spacing the packaged device from the array of lead with the surface guide.

59. The method of claim 54 wherein the packaged device is a first packaged device having a first package profile and the alignment element is a first alignment element, and further comprising:
   removing the first packaged device from the socket;
   positioning a second alignment element in the socket, the second packaged device having a second array of contacts and a second package profile different from the first package profile;
   positioning a second packaged device in the second alignment element with a second array of contacts of the second packaged device in direct alignment with an array of leads in the socket;
   restricting lateral movement of the second packaged device relative to the reference plane;
   connecting the second packaged device to the socket with the second array of contacts coupled to the array of leads;
   removing the second alignment element from the socket without removing the second packaged device from the socket; and
   testing the second packaged device in the socket.

60. A method of testing first and second packaged devices, the first packaged devices having common first arrays of contacts and common first package profiles, and the second packaged devices having common second arrays of contacts and common second package profiles different from the first package profiles, comprising:
   loading the first packaged devices in the sockets through a set of first alignment elements, the set of first aligning elements laterally aligning the first package profiles relative to respective reference planes;
   coupling the first arrays of contacts of the first packaged devices with arrays of leads in the sockets at the respective reference planes;
   removing the set of first alignment elements from the sockets without removing the first packaged devices from the sockets;
   testing the first packaged devices;
   removing the first packaged devices from the sockets;
   replacing the set of first alignment elements with a set of second alignment elements;
   loading the second packaged devices in the sockets through the set of second alignment elements, the set of second aligning elements laterally aligning the second package profiles relative to the respective reference planes;
   coupling the second arrays of contacts of the second packaged devices with the arrays of leads in the sockets at the respective reference planes;

removing the set of second alignment elements from the sockets without removing the second packaged devices from the sockets; and testing the second packaged devices.

61. The method of claim 60, further comprising positioning the first packaged devices apart from the arrays of leads along axes normal to the reference planes when the first packaged devices are connected to the sockets.

62. The method of claim 60 wherein testing includes burn-in testing of the first and second packaged devices.

63. The method of claim 60, further comprising positioning a surface guides on the sockets adjacent to the arrays of leads before the set of first alignment elements and the first packaged devices are positioned in the sockets, and spacing the first packaged devices from the arrays of leads with the surface guides.

64. The method of claim 60 wherein loading the first packaged devices in the sockets includes passing the first packaged devices through alignment apertures having tapered bearing surfaces terminating at openings through which the set of first alignment elements can pass along load/unload paths, the tapered bearing surfaces restricting movement of the set of first aligning elements lateral to the load/unload paths.

65. The method of claim 60 wherein loading the second packaged devices in the sockets includes passing the second packaged devices through alignment apertures having tapered bearing surfaces terminating at openings through which the set of second alignment elements can pass along load/unload paths, the tapered bearing surfaces restricting movement of the set of first aligning elements lateral to the load/unload paths.

* * * * *